United States Patent
Price et al.

(10) Patent No.: US 9,647,551 B2
(45) Date of Patent: May 9, 2017

(54) SWITCHED POWER CONTROL CIRCUITS FOR CONTROLLING THE RATE OF PROVIDING VOLTAGES TO POWERED CIRCUITS, AND RELATED SYSTEMS AND METHODS

(71) Applicant: QUALCOMM Incorporated, San Diego, CA (US)

(72) Inventors: Burt Lee Price, Apex, NC (US); Yeshwant Nagaraj Kolla, Wake Forest, NC (US); Dhaval Rajeshbhai Shah, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/826,472

(22) Filed: Aug. 14, 2015

(65) Prior Publication Data

US 2017/0047842 A1 Feb. 16, 2017

(51) Int. Cl.
*H02M 3/158* (2006.01)

(52) U.S. Cl.
CPC .................... *H02M 3/158* (2013.01)

(58) Field of Classification Search
None
See application file for complete search history.

(56) References Cited

U.S. PATENT DOCUMENTS

| 4,504,779 A | 3/1985 | Haman |
| 6,690,147 B2 * | 2/2004 | Bonto ............... G05F 1/575 323/273 |
| 6,724,601 B2 | 4/2004 | Lien et al. |
| 7,432,747 B1 * | 10/2008 | Liu ............... H03K 17/145 326/82 |

(Continued)

FOREIGN PATENT DOCUMENTS

WO 9712443 A1 4/1997

OTHER PUBLICATIONS

Jiao, Hailong et al., "Multi-Phase Sleep Signal Modulation for Mode Transition Noise Mitigation in MTCOMS Circuits," 2012 International SoC Design Conference (ISOCC), Nov. 4-7, 2012, IEEE, pp. 466-469.

(Continued)

*Primary Examiner* — Emily P Pham
(74) *Attorney, Agent, or Firm* — Peter Michael Kamarchik; Kenneth Vu

(57) ABSTRACT

Switched power control circuits for controlling the rate of providing voltages to powered circuits are disclosed. In one aspect, a switched power control circuit is provided that is configured to control activation of a headswitch circuit such that the headswitch circuit gradually provides a supply voltage to a powered circuit rather than providing full supply voltage in a substantially instantaneous manner. To gradually ramp up an output voltage, the headswitch circuit is configured to provide the output voltage to the powered circuit in response to a control signal received on a control (Continued)

input. The control signal is generated by a control circuit in response to an enable signal. To prevent the headswitch circuit from providing the full supply voltage to the powered circuit instantaneously, a current sink circuit is configured to control a ramping rate of the output voltage generated by the headswitch circuit.

24 Claims, 12 Drawing Sheets

(56) References Cited

U.S. PATENT DOCUMENTS

| | | | | |
|---|---|---|---|---|
| 7,554,305 | B2* | 6/2009 | Nunokawa | G05F 1/575 |
| | | | | 323/273 |
| 7,560,973 | B2* | 7/2009 | Rincon-Mora | H03F 3/21 |
| | | | | 327/427 |
| 7,791,406 | B1 | 9/2010 | Wang et al. | |
| 7,809,408 | B2 | 10/2010 | Lee | |
| 8,183,713 | B2 | 5/2012 | Rao et al. | |
| 8,542,178 | B2* | 9/2013 | Yoo | G09G 3/20 |
| | | | | 345/100 |
| 2005/0007178 | A1* | 1/2005 | Fahim | H03K 17/063 |
| | | | | 327/390 |
| 2008/0024205 | A1 | 1/2008 | Lee | |
| 2009/0121774 | A1 | 5/2009 | Dathe et al. | |
| 2013/0105951 | A1 | 5/2013 | Popovich et al. | |
| 2014/0247652 | A1* | 9/2014 | Jin | G05F 3/02 |
| | | | | 365/154 |

OTHER PUBLICATIONS

Kim, Suhwan et al., "Minimizing Inductive Noise in System-On-a-Chip with Multiple Power Gating Structures," Proceedings of the 29th European Solid-State Circuits Conference, Sep. 16-18, 2003, IEEE, pp. 635-638.

International Search Report and Written Opinion for PCT/US2016/041976, mailed Oct. 5, 2016, 17 pages.

* cited by examiner

SWITCHED POWER CONTROL CIRCUITS FOR CONTROLLING THE RATE OF PROVIDING VOLTAGES TO POWERED CIRCUITS, AND RELATED SYSTEMS AND METHODS

BACKGROUND

I. Field of the Disclosure

The technology of the disclosure relates generally to controlling voltage slew rates, and particularly to circuits that control the rate at which voltage is supplied to a load circuit.

II. Background

Processor-based systems employ voltage supply sources for providing voltage to various components for operation. Rather than coupling voltage supply sources directly to the components, a processor-based system may employ headswitch devices that distribute voltage from one or more voltage supply sources within the processor-based system. Notably, instead of continuously providing voltage to components within the processor-based system, headswitch devices can be provided and configured to provide voltage to corresponding power distribution networks within these components during active operation. In this manner, power consumption of a processor-based system may be reduced when components are not operating.

For example, to provide voltage to a processor core for powering the processor core, multiple headswitch devices are commonly disposed at locations on a processing system die around a perimeter of the processor core. Distributing the placement of headswitch devices strategically at locations around the perimeter of the processing core allows a supply voltage to be provided to multiple areas of the processor core with less complex wiring, as compared to providing the supply voltage from a single node. In this manner, the headswitch devices are configured to receive the supply voltage from one or more voltage supply sources. To control the distribution of the supply voltage from the headswitch devices distributed on the processing system die, the headswitch devices are configured to be controlled by control signals. The control signals are provided from the processor core to activate the headswitch devices to supply power to the power distribution network of the processor core.

However, prior to receiving the supply voltage from the headswitch devices, the processor core may be in an idle state, wherein voltage provided to the processor core may be reduced or collapsed to reduce power consumption. Thus, the voltage level of the corresponding power distribution network within the processor core may be approximately equal to zero Volts (0V). However, when the processor core transitions from an idle state to an active state, the processor core sends a control signal to the headswitch devices to increase the voltage provided to the processor core. Upon receiving the supply voltage from the voltage supply sources by way of the headswitch devices, the voltage of the processor core is raised from a lower voltage to the supply voltage in a substantially instantaneous manner. This fast voltage step may cause prolonged resonance within the power distribution network of the processor core. Notably, a processor core cannot operate until resonance on the corresponding power distribution network subsides. However, delaying operation of a processor core until resonance on the power distribution network subsides reduces the performance of the processor core.

SUMMARY OF THE DISCLOSURE

Aspects disclosed in the detailed description include switched power control circuits for controlling the rate of providing voltages to powered circuits. Related systems and methods are also disclosed. In one aspect, a switched power control circuit is provided. The switched power control circuit is configured to control activation of a headswitch circuit such that the headswitch circuit gradually provides a supply voltage to a powered circuit. This is as opposed to providing the full supply voltage in a substantially instantaneous manner. To gradually provide the supply voltage, an output voltage is provided, wherein the output voltage is ramped up to the supply voltage. To gradually ramp up the output voltage provided by the headswitch circuit to the powered circuit, the headswitch circuit is configured to provide the output voltage generated from a voltage supply source to the powered circuit in response to a control signal received on a control input. The control signal is generated by a control circuit in response to an enable signal. To prevent the headswitch circuit from instantaneously providing the full supply voltage to the powered circuit, a current sink circuit is provided. The current sink circuit is configured to control a ramping rate of the output voltage generated by the headswitch circuit. Controlling the ramping rate corresponds to gradually activating the headswitch circuit over time, wherein the amount of supply voltage allowed to pass through the headswitch circuit is limited by the level of activation of the headswitch circuit. By using the switched power control circuit to gradually provide the supply voltage, the switched power control circuit may provide the supply voltage in a controlled manner, which may reduce or avoid prolonged resonance on a power distribution network within the powered circuit. Because the powered circuit delays operation until such resonance subsides, using the switched power control circuit to reduce or avoid the resonance increases the performance of the powered circuit.

In this regard, in one aspect, a switched power control circuit is disclosed. The switched power control circuit comprises a headswitch circuit. The headswitch circuit is configured to provide an output voltage generated from a voltage supply source to a powered circuit in response to a control signal received on a control input. The switched power control circuit further comprises a control circuit configured to generate the control signal to control the providing of the output voltage by the headswitch circuit to the powered circuit in response to an enable signal. The switched power control circuit further comprises a current sink circuit coupled to the control input, the current sink circuit configured to control a ramping rate of the output voltage generated by the headswitch circuit.

In another aspect, a switched power control circuit is disclosed. The switched power control circuit comprises a means for providing an output voltage generated from a voltage supply source to a powered circuit in response to a control signal received on a control input. The switched power control circuit further comprises a means for generating the control signal to control the providing of the output voltage by the means for providing the output voltage to the powered circuit. The switched power control circuit further comprises a means for controlling a ramping rate of the output voltage generated by the means for providing the output voltage to the powered circuit.

In another aspect, a method for gradually providing a supply voltage to a powered circuit is disclosed. The method comprises generating a control signal to control providing of an output voltage generated from a voltage supply source by a headswitch circuit to a powered circuit in response to an enable signal. The method further comprises controlling a ramping rate of the output voltage generated by the headswitch circuit by a current sink circuit coupled to a control input of the headswitch circuit. The method further comprises providing the output voltage to the powered circuit from the headswitch circuit in response to the control signal received on the control input.

In another aspect, a block headswitch system is disclosed. The block headswitch system comprises a plurality of switched power control circuits. Each switched power control circuit comprises an enable input configured to receive an enable signal. Each switched power control circuit further comprises an enable output configured to provide the enable signal. Each switched power control circuit further comprises a headswitch circuit configured to provide an output voltage generated from a voltage supply source to a powered circuit in response to a control signal received on a control input. Each switched power control circuit further comprises a control circuit configured to generate the control signal to control the providing of the output voltage by the headswitch circuit to the powered circuit in response to the enable signal. Each switched power control circuit further comprises a current sink circuit coupled to the control input. The current sink circuit is configured to control a ramping rate of the output voltage generated by the headswitch circuit.

DETAILED DESCRIPTION

Figure 1:
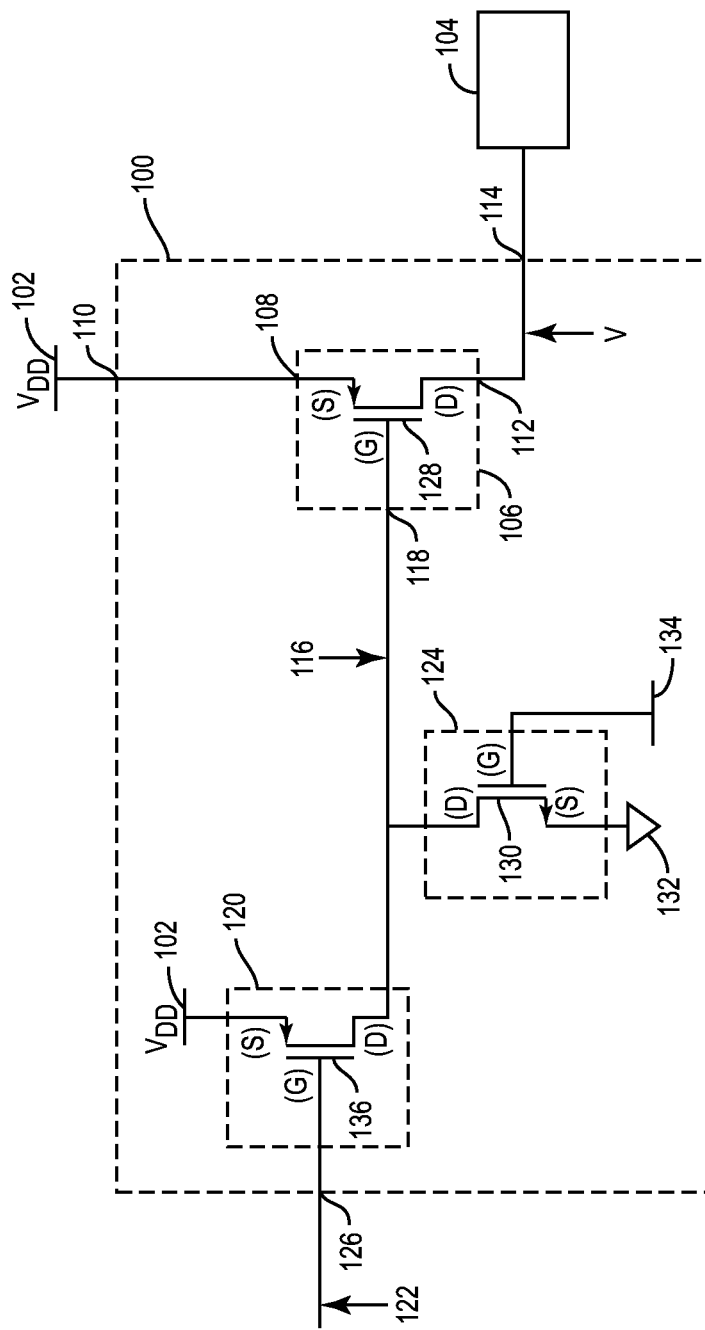
FIG. 1 is a circuit diagram of an exemplary switched power control circuit configured to gradually provide a supply voltage to a powered circuit to reduce or avoid resonance in the powered circuit, and thus increase performance.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

FIG. 1 illustrates an exemplary switched power control circuit 100 configured to gradually provide a supply voltage ($V_{DD}$) from a voltage supply source 102 to a powered circuit 104. To gradually provide the supply voltage ($V_{DD}$), an output voltage (V) is provided, wherein the output voltage (V) is ramped up to the supply voltage ($V_{DD}$). By gradually providing the supply voltage ($V_{DD}$) to the powered circuit 104, the switched power control circuit 100 may provide the supply voltage ($V_{DD}$) in a controlled manner, which may reduce or avoid resonance in a power distribution network (PDN) (not shown) of the powered circuit 104, thus increasing the performance of the powered circuit 104. To achieve this gradual ramping up of the output voltage (V), the switched power control circuit 100 employs a headswitch circuit 106 that is configured to provide the output voltage (V) generated from the voltage supply source 102 to the powered circuit 104. The headswitch circuit 106 includes a voltage input 108 that is coupled to a voltage input 110 of the switched power control circuit 100 and configured to receive the supply voltage ($V_{DD}$) generated by the voltage supply source 102. The headswitch circuit 106 also includes a voltage output 112 that is coupled to a voltage output 114 of the switched power control circuit 100 and configured to provide the output voltage (V) to the powered circuit 104. The headswitch circuit 106 is configured to provide the output voltage (V) to the powered circuit 104 in response to a control signal 116 received on a control input 118. The control signal 116 is generated by a control circuit 120 in response to an enable signal 122. The switched power control circuit 100 also includes a current sink circuit 124 configured to control a ramping rate of the output voltage (V) generated by the headswitch circuit 106, thus allowing the headswitch circuit 106 to provide the full supply voltage ($V_{DD}$) to the powered circuit 104 in a controlled manner to reduce or avoid resonance in the PDN of the powered circuit 104. Controlling the ramping rate corresponds to gradually activating (i.e., gradually turning-on) the headswitch circuit 106 over time, wherein the amount of supply voltage ($V_{DD}$) allowed across the headswitch circuit 106 is limited by its level of activation.

With continuing reference to FIG. 1, in this aspect, the headswitch circuit 106 is controlled by the current sink circuit 124 when the control circuit 120 generates the control signal 116 in response to the enable signal 122 received on an enable input 126 of the switched power control circuit 100. The control signal 116 indicates that the supply voltage ($V_{DD}$) is to be transferred from the voltage supply source 102 to the powered circuit 104. By using the switched power control circuit 100 to gradually provide the supply voltage ($V_{DD}$) in a controlled manner, the switched power control circuit 100 reduces or avoids prolonged resonance on the power distribution network within the powered circuit 104. Because the powered circuit 104 delays operation until such resonance subsides, using the switched power control circuit 100 to reduce or avoid this resonance increases the performance of the powered circuit 104.

With continuing reference to FIG. 1, components within the switched power control circuit 100 may employ various circuit elements to achieve the functionality described above. In this aspect, the headswitch circuit 106 employs a p-type metal oxide semiconductor (PMOS) transistor 128. The PMOS transistor 128 includes a source (S) that is coupled to the voltage input 108, a gate (G) that is coupled to the control input 116, and a drain (D) that is coupled to the voltage output 112. Additionally, in this aspect, the current sink circuit 124 includes an n-type metal oxide semiconductor (NMOS) transistor 130. The NMOS transistor 130 includes a source (S) that is coupled to a ground source 132, a drain (D) that is coupled to the gate (G) of the PMOS transistor 128 of the headswitch circuit 106 (i.e., the control input 118), and a gate (G). The gate (G) of the NMOS transistor 130 in this aspect is driven by a constant voltage source 134. The control circuit 120 in this example employs a PMOS transistor 136. The PMOS transistor 136 includes a source (S) that is coupled to the voltage supply source 102, a gate (G) that is configured to receive the enable signal 122, and a drain (D) that is coupled to the gate (G) of the PMOS transistor 128 of the headswitch circuit 106 and the drain (D) of the NMOS transistor 130 of the current sink circuit 124. Notably, other aspects may employ coupling the source (S) of the PMOS transistor 136 to a voltage supply source other than the voltage supply source 102.

With continuing reference to FIG. 1, the functionality of the switched power control circuit 100 is now described in detail. Because the enable signal 122 is coupled to the gate (G) of the PMOS transistor 136 of the control circuit 120, the PMOS transistor 136 is activated (i.e., turned-on) while the enable signal 122 has a logic low '0' value. Further, the supply voltage ($V_{DD}$) from the voltage supply source 102 is provided to the gate (G) of the PMOS transistor 128 of the headswitch circuit 106 while the PMOS transistor 136 is activated. Providing the supply voltage ($V_{DD}$) to the gate (G) of the PMOS transistor 128 deactivates (i.e., turns-off) the PMOS transistor 128 and prevents the supply voltage ($V_{DD}$) from being provided to the powered circuit 104.

In response to the enable signal 122 transitioning to a logic high '1' value, the PMOS transistor 136 of the control circuit 120 is deactivated, which prevents the supply voltage ($V_{DD}$) of the voltage supply source 102 from being provided to the gate (G) of the PMOS transistor 128 of the headswitch circuit 106. However, although the gate (G) of the PMOS transistor 128 is no longer receiving the supply voltage ($V_{DD}$) from the voltage supply source 102, the supply voltage ($V_{DD}$) remains on the gate (G) of the PMOS transistor 128, as a gate capacitance associated with the gate (G) of the PMOS transistor 128 is charged with the supply voltage ($V_{DD}$) while the enable signal 122 has a logic low value '0'.

With continuing reference to FIG. 1, because the supply voltage ($V_{DD}$) provided by the control circuit 120 no longer deactivates the PMOS transistor 128 of the headswitch circuit 106, the PMOS transistor 128 may be activated so as to provide the output voltage (V) generated from the voltage supply source 102 to the powered circuit 104. However, rather than fully activating the PMOS transistor 128 in a substantially instantaneous manner, the current sink circuit 124 is configured to gradually activate the PMOS transistor 128 over time such that the output voltage (V) provided by the headswitch circuit 106 ramps up over time. The gate (G) of the NMOS transistor 130 of the current sink circuit 124 is driven by the constant voltage source 134 in this example so as to activate the NMOS transistor 130 to a level that causes the voltage on the gate (G) of the PMOS transistor 128 of the headswitch circuit 106 to gradually discharge through the NMOS transistor 130 to the ground source 132.

With continuing reference to FIG. 1, as the voltage on the gate (G) of the PMOS transistor 128 discharges, the PMOS transistor 128 gradually activates. Notably, the level of the output voltage (V) provided to the powered circuit 104 by the headswitch circuit 106 corresponds to the level at which the PMOS transistor 128 is activated. In other words, as the current sink circuit 124 discharges the voltage on the gate (G) of the PMOS transistor 128, the voltage on the gate (G) of the PMOS transistor 128 crosses a threshold voltage ($V_t$) of the PMOS transistor 128. As the voltage on the gate (G) of the PMOS transistor 128 crosses the threshold voltage ($V_t$), the PMOS transistor 128 turns-on and provides a progressively higher output voltage (V) to the powered circuit 104. In this manner, the output voltage (V) provided to the powered circuit 104 gradually ramps up to the full supply voltage ($V_{DD}$) as the voltage on the gate (G) of the PMOS transistor 128 crosses the threshold voltage ($V_t$). By using the switched power control circuit 100 to gradually provide the supply voltage ($V_{DD}$) in this manner, the switched power control circuit 100 reduces or avoids prolonged resonance on the power distribution network within the powered circuit 104. Because the powered circuit 104 delays operation until such resonance subsides, using the switched power control circuit 100 to reduce or avoid this resonance increases the performance of the powered circuit 104.

Figure 2:
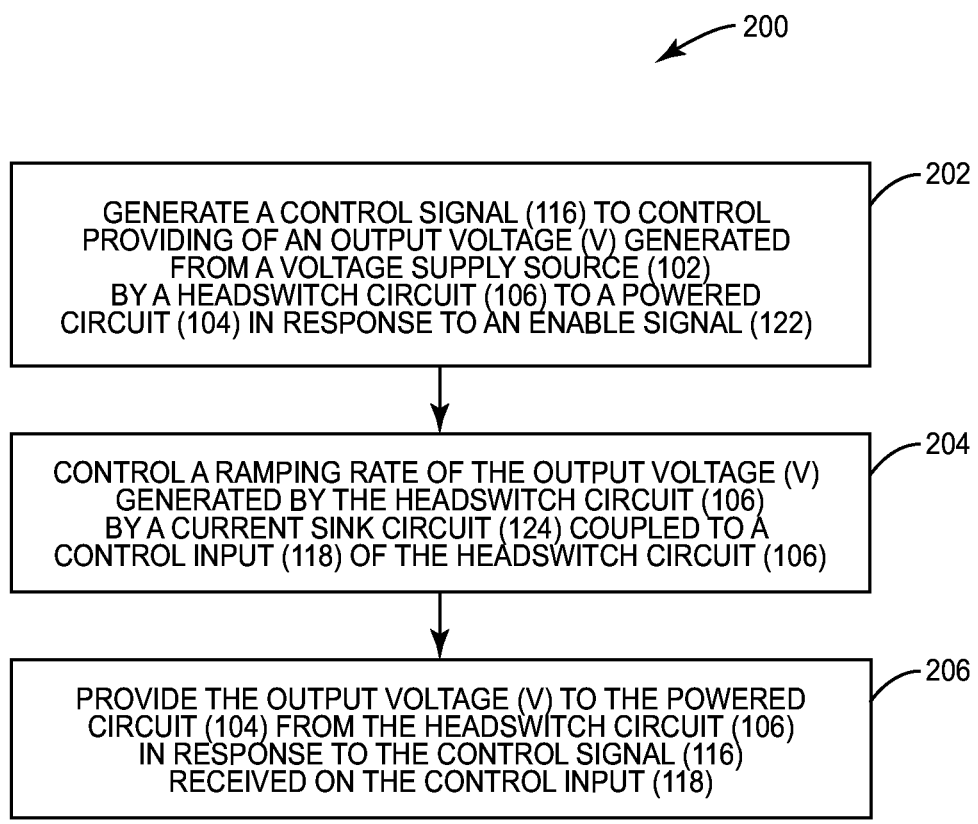
FIG. 2 is a flowchart illustrating an exemplary process for gradually providing the supply voltage to the powered circuit in FIG. 1 to reduce or avoid resonance in the powered circuit.

In this regard, FIG. 2 illustrates an exemplary process 200 employed by the switched power control circuit 100 in FIG. 1 to gradually provide the supply voltage ($V_{DD}$) to the powered circuit 104 to reduce or avoid resonance in the powered circuit 104. The process 200 includes generating the control signal 116 to control providing of the output voltage (V) generated from the voltage supply source 102 by the headswitch circuit 106 to the powered circuit 104 in response to the enable signal 122 (block 202). The process 200 also includes controlling the ramping rate of the output voltage (V) generated by the headswitch circuit 106 by the current sink circuit 124 coupled to the control input 118 of the headswitch circuit 106 (block 204). The process 200 further includes providing the output voltage (V) to the powered circuit 104 from the headswitch circuit 106 in response to the control signal 116 received on the control input 118 (block 206). By employing the process 200, the switched power control circuit 100 reduces or avoids prolonged resonance on the power distribution network within the powered circuit 104. Because the powered circuit 104 delays operation until such resonance subsides, using the switched power control circuit 100 to reduce or avoid this resonance increases the performance of the powered circuit 104.

Figure 3:
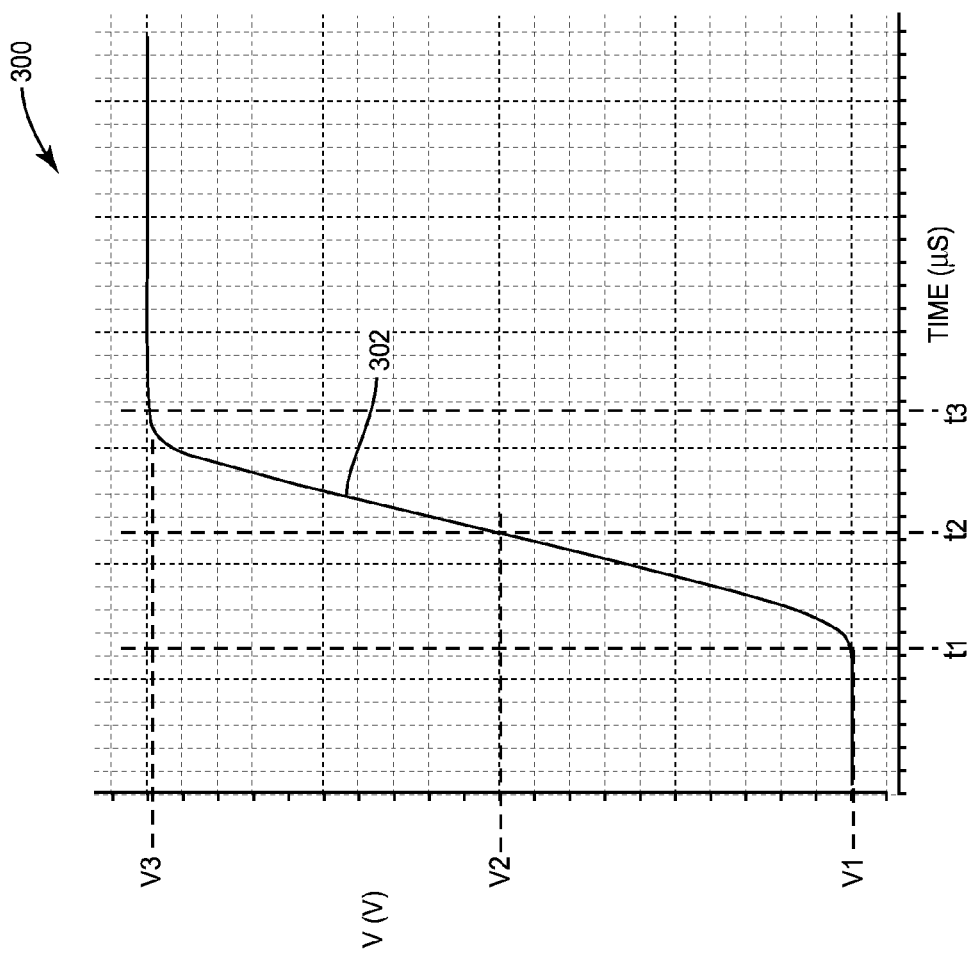
FIG. 3 is a graph illustrating that the supply voltage provided by the switched power control circuit in FIG. 1 is provided gradually over time.

In this regard, FIG. 3 includes a graph 300 illustrating that the supply voltage ($V_{DD}$) provided by the switched power control circuit 100 in FIG. 1 is provided gradually over time. A line 302 in the graph 300 represents the amount of the supply voltage ($V_{DD}$) (i.e., the output voltage (V)) provided to the powered circuit 104 versus time. In this aspect, in response to the enable signal 122 activating the control circuit 120 in FIG. 1, activation of the headswitch circuit 106 begins at time t1. Thus, at time t1, the level of the supply voltage ($V_{DD}$) provided by the switched power control circuit 100 to the powered circuit 104 is approximately equal to voltage V1. As time progresses, the current sink circuit 124 in FIG. 1 controls the headswitch circuit 106 to activate further, and thus provide a greater level of the supply voltage ($V_{DD}$) to the powered circuit 104. In this aspect, as previously described, conditioning by the current sink circuit 124 involves discharging the voltage on the gate (G) of the PMOS transistor 128 of the headswitch circuit 106. At time t2, the level of the supply voltage ($V_{DD}$) provided by the switched power control circuit 100 to the powered circuit 104 is approximately equal to voltage V2. The headswitch circuit 106 gradually reaches full activation at time t3, wherein the level of the supply voltage ($V_{DD}$) provided to the powered circuit 104 is approximately equal to voltage V3. Therefore, the gradual ramp up of the supply voltage ($V_{DD}$) illustrated in the graph 300 provided by the switched power control circuit 100 reduces or avoids resonance in the power distribution network of the powered circuit 104, thus increasing the performance of the powered circuit 104.

Notably, the headswitch circuit 106 may also be referred to herein as a means for providing the output voltage (V) generated from the voltage supply source 102 to the powered circuit 104. The control circuit 120 may also be referred to herein as a means for generating the control signal 116 to control the providing of the output voltage (V). Further, the current sink circuit 124 may also be referred to herein as a means for controlling the ramping rate of the output voltage (V) generated by the headswitch circuit 106.

Figure 4:
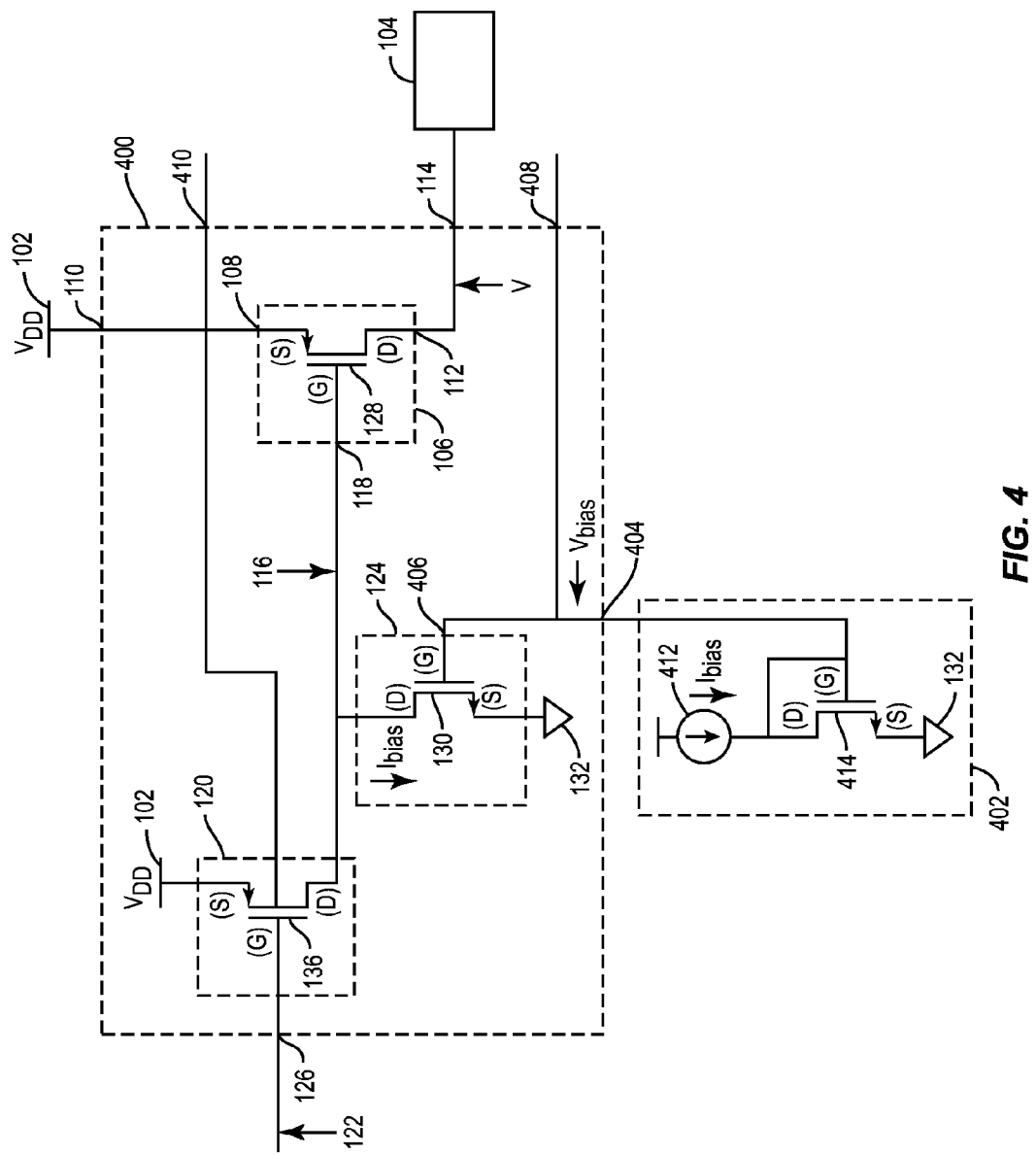
FIG. 4 is a circuit diagram of an exemplary switched power control circuit configured to gradually provide a supply voltage to a powered circuit to reduce or avoid resonance in the powered circuit, wherein a ramping rate of an output voltage is controlled by a bias generator circuit.

As discussed above, the constant voltage source 134 is used to drive the current sink circuit 124 such that the current sink circuit 124 can control the ramping rate of the output voltage (V) generated by the headswitch circuit 106. However, due to process, voltage, and temperature (PVT) variations, situations arise in which having the option to program the ramping rate would be helpful. In this regard, FIG. 4 illustrates another exemplary switched power control circuit 400 configured to gradually provide the supply voltage ($V_{DD}$) to the powered circuit 104 to reduce or avoid resonance in the powered circuit 104, wherein the ramping rate of the output voltage (V) is controlled by a bias generator circuit 402 instead of the constant voltage source 134 in FIG. 1. The switched power control circuit 400 includes common elements with the switched power control circuit 100 in FIG. 1, wherein such elements share common element numbers between FIGS. 1 and 4, and thus will not be re-described. The switched power control circuit 400 employs a bias generator input 404 that is coupled to a bias input 406 of the current sink circuit 124 and is configured to receive a bias voltage ($V_{bias}$) from the bias generator circuit 402. As discussed in greater detail below, the switched power control circuit 400 also includes a bias generator output 408 that is configured to provide the bias voltage ($V_{bias}$) to other components. Similarly, the switched power control circuit 400 includes an enable output 410 that is configured to provide the enable signal 122 to other components. Further, the bias generator circuit 402 is configured to provide the bias voltage ($V_{bias}$) such that the current sink circuit 124 mirrors a bias current ($I_{bias}$) which biases the current sink circuit 124 so as to control the rate at which the headswitch circuit 106 is activated. Although the bias generator circuit 402 may consume more area than the constant voltage source 134 in FIG. 1, driving the current sink circuit 124 using the bias generator circuit 402 provides greater control over the ramping rate of the output voltage (V).

With continuing reference to FIG. 4, as previously described, rather than fully activating the PMOS transistor 128 in a substantially instantaneous manner, the current sink circuit 124 is configured to gradually activate the PMOS transistor 128 over time. In this manner, the gate (G) of the NMOS transistor 130 of the current sink circuit 124 mirrors the bias current ($I_{bias}$) from the bias generator circuit 402. In response to mirroring the bias current ($I_{bias}$), the NMOS transistor 130 is activated to a level that causes the voltage on the gate (G) of the PMOS transistor 128 of the headswitch circuit 106 to gradually discharge through the NMOS transistor 130 to the ground source 132. Notably, in this aspect, the bias generator circuit 402 includes a current source 412 coupled to a drain (D) and a gate (G) of an NMOS transistor 414. A source (S) of the NMOS transistor 414 is coupled to the ground source 132. Thus, the strength of the current source 412 determines to what level the NMOS transistor 414 is activated, which controls the level of the bias voltage ($V_{bias}$) that is provided from the bias generator circuit 402 to the switched power control circuit 400. By using the switched power control circuit 400 to gradually provide the supply voltage ($V_{DD}$) in this manner, the switched power control circuit 400 reduces or avoids prolonged resonance on the power distribution network as previously described. Additionally, employing the bias generator circuit 402 provides greater programmability of the ramping rate of the output voltage (V) generated by the headswitch circuit 106, thus enabling the switched power control circuit 400 control over mitigating issues caused by PVT variations.

Figure 5:
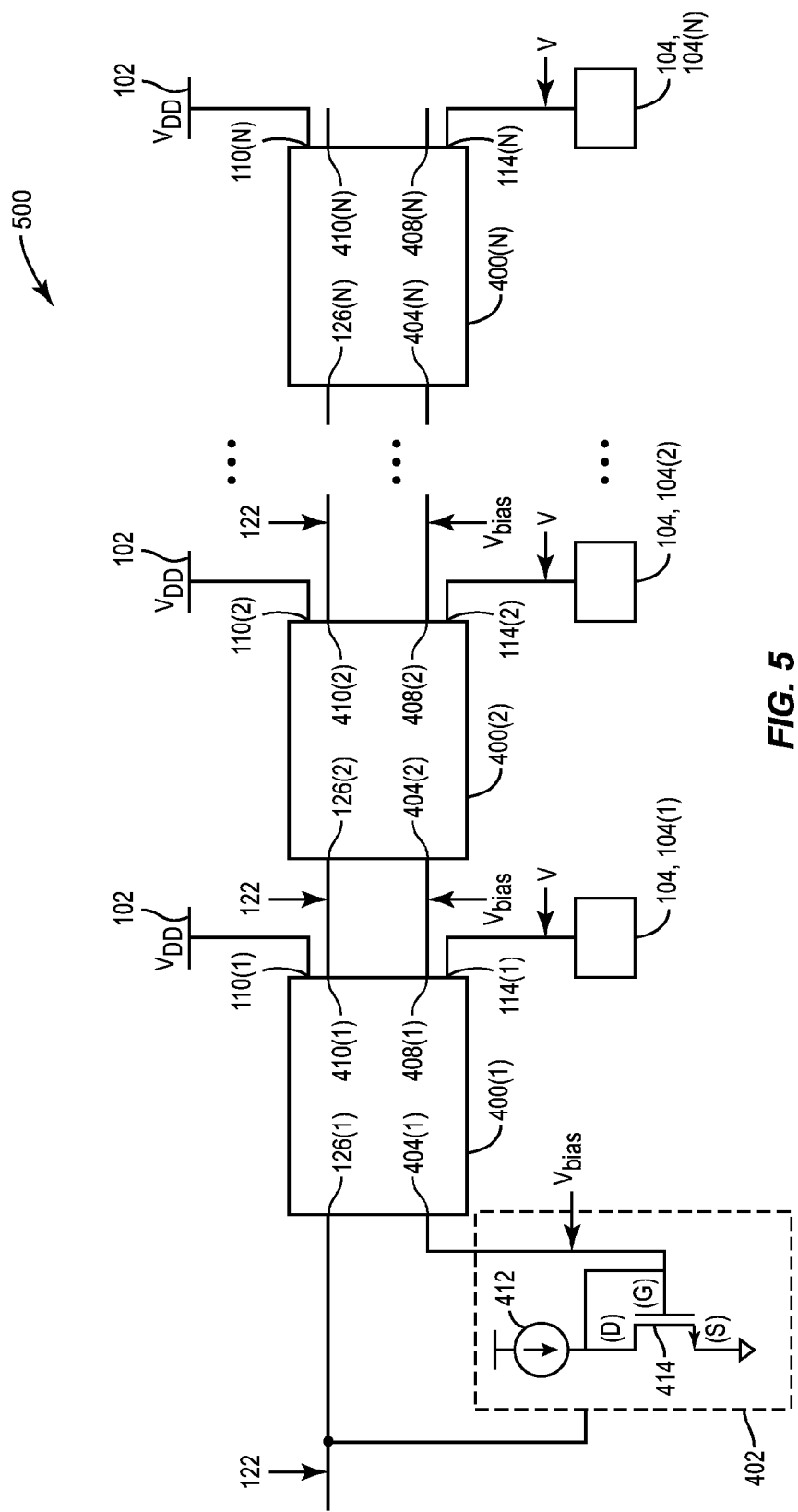
FIG. 5 is a block diagram of an exemplary block headswitch system configured to gradually provide a supply voltage to a processor core to reduce or avoid resonance on a power distribution network within the processor core.

Additionally, multiple instances of the switched power control circuit 400 in FIG. 4 may be tiled together to form a larger headswitch system. In other words, a plurality of switched power control circuits 400 may be coupled, wherein each instance of the switched power control circuit 400 is configured to provide a voltage to an instance of the powered circuit 104. In this regard, FIG. 5 illustrates an exemplary block headswitch system 500 that is configured to gradually provide a supply voltage ($V_{DD}$) from the voltage supply source 102 to the powered circuit 104 to reduce or avoid resonance on the power distribution network (not shown) within the powered circuit 104. Notably, elements associated with each instance of the switched power control circuit 400 were previously described in FIG. 4, and thus will not be re-described herein. The block headswitch system 500 includes switched power control circuits 400(1)-400(N), wherein each of the switched power control circuits 400(1)-400(N) is configured to gradually provide the supply voltage ($V_{DD}$) from the voltage supply source 102 to the powered circuit 104.

With continuing reference to FIG. 5, the enable signal 122 is provided to the bias generator 402, wherein the bias generator 402 is configured to provide the bias voltage ($V_{bias}$) to the switched power control circuit 400(1) via the bias generator input 404(1) in response to the enable signal 122 transitioning to a logic high '1' value. Notably, the bias generator output 408(1) of the switched power control circuit 400(1) is coupled to the bias generator input 404(2) of the switched power control circuit 400(2). In this manner, the tiled nature of the block headswitch system 500 allows the bias voltage ($V_{bias}$) to be provided from the switched power control circuit 400(1) to the switched power control circuit 400(2), and so on, for each of the switched power control circuits 400(1)-400(N). Thus, the block headswitch system 500 may bias each of the switched power control circuits 400(1)-400(N) using only one (1) bias generator 402.

With continuing reference to FIG. 5, the enable signal 122 is also provided to the switched power control circuit 400(1) via the enable input 126(1). As previously described with reference to FIG. 4, the switched power control circuit 400(1) is configured to gradually provide the supply voltage ($V_{DD}$) received on the voltage input 110(1) from the voltage supply source 102 to the powered circuit 104 via the voltage output 114(1) in response to the enable signal 122 having a logic high '1' value. The enable output 410(1) of the switched power control circuit 400(1) is coupled to the enable input 126(2) of the switched power control circuit 400(2). Notably, other aspects may employ non-inverting buffers (not shown) between the enable input 126(1) and the enable output 410(1) and/or between the enable output 410(1) and the enable input 126(2) to drive the enable signal 122. Thus, the tiled nature of the block headswitch system 500 also allows the enable signal 122 to be provided from the switched power control circuit 400(1) to the switched power control circuit 400(2), and so on, for each of the switched power control circuits 400(1)-400(N).

With continuing reference to FIG. 5, as a non-limiting example, the powered circuit 104 may be a single processor core, wherein each of the switched power control circuits 400(1)-400(N) is configured to provide the supply voltage ($V_{DD}$) to a particular node of the single processor core. In other words, each switched power control circuit 400(1)-400(N) is configured to provide the supply voltage ($V_{DD}$) to a certain node of the powered circuit 104. Notably, although this aspect provides the supply voltage ($V_{DD}$) to the one (1) powered circuit 104, alternative aspects may be configured to provide the supply voltage ($V_{DD}$) from each switched power control circuit 400(1)-400(N) to multiple corresponding powered circuits 104(1)-104(N). As a non-limiting example, in such aspects the block headswitch system 500 may be configured to provide the supply voltage ($V_{DD}$) to multiple processor cores, thus allowing the possibility of simultaneously bringing up multiple processor cores with a main power supply, such as the voltage supply source 102. Further, although this aspect provides the supply voltage ($V_{DD}$) from the one (1) voltage supply source 102, other aspects may be configured to receive the supply voltage ($V_{DD}$) from multiple voltage supply sources 102(1)-102(N) (not shown). Therefore, the switched power control circuits 400(1)-400(N) of the block headswitch system 500 reduce or avoid prolonged resonance on the power distribution network within the powered circuit 104 (or within the power distribution networks of the powered circuits 104(1)-104(N)). Because the powered circuit 104 (powered circuits 104(1)-104(N)) delays operation until such resonance subsides, using the switched power control circuits 400(1)-400(N) to reduce or avoid this resonance increases the performance of the powered circuit 104 (powered circuits 104(1)-104(N)).

Figure 6:
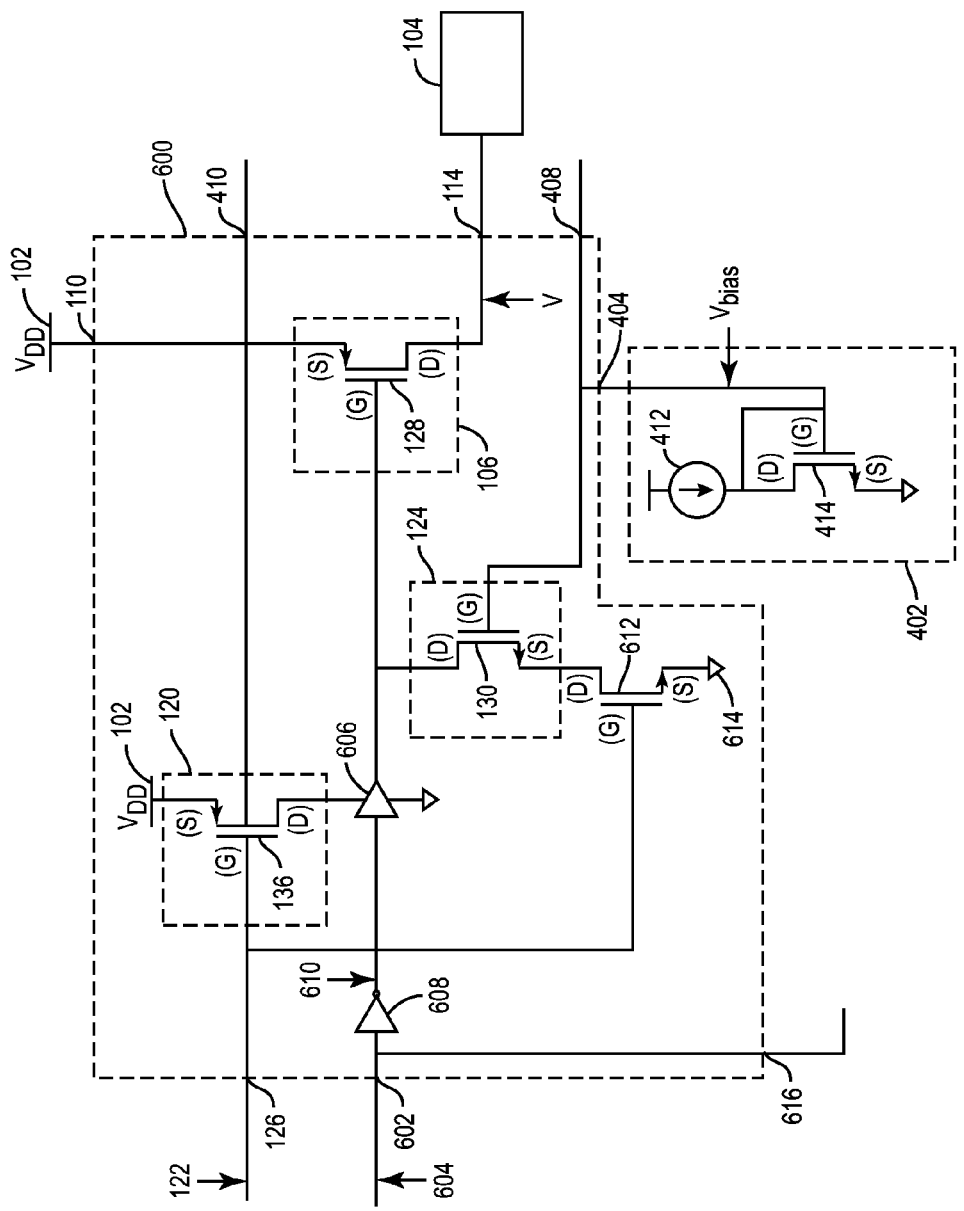
FIG. 6 is a circuit diagram of another exemplary switched power control circuit configured to gradually provide a supply voltage to a powered circuit to reduce or avoid resonance in the powered circuit, and thus increase performance.

In addition to the switched power control circuits 100, 400 in FIGS. 1 and 4, respectively, other aspects may include additional components and functionality. In this regard, FIG. 6 illustrates another exemplary switched power control circuit 600 configured to gradually provide a supply voltage ($V_{DD}$) to the powered circuit 104 to reduce or avoid resonance in the power distribution network (not shown) of the powered circuit 104, thus increasing performance of the powered circuit 104. Notably, the switched power control circuit 600 includes common elements with the switched power control circuit 400 in FIG. 4 wherein such elements share common element numbers between FIGS. 4 and 6, and thus will not be re-described herein.

With continuing reference to FIG. 6, the switched power control circuit 600 employs a fast enable input 602 that is configured to receive a fast enable signal 604. Notably, the fast enable signal 604 provides the switched power control circuit 600 with the option of providing the supply voltage ($V_{DD}$) to the powered circuit 104 in a substantially instantaneous manner rather than gradually providing the supply voltage ($V_{DD}$) over time. The switched power control circuit 600 employs a fast enable buffer 606 that is configured to receive the fast enable signal 604 and provide the fast enable signal 604 to the headswitch circuit 106 in response to the enable signal 122 transitioning to a logic low '0' value. In this aspect, when the enable signal 122 transitions to a logic low '0' value, the PMOS transistor 136 of the control circuit 120 is activated, allowing the supply voltage ($V_{DD}$) from the voltage supply source 102 to activate the fast enable buffer 606. Notably, because the headswitch circuit 106 employs the PMOS transistor 128 in this aspect, an inverter 608 is configured to invert the fast enable signal 604, wherein an inverted fast enable signal 610 is provided to the fast enable buffer 606. However, alternative aspects that configure the headswitch circuit 106 to be active high instead of active low may achieve similar functionality without the inverter 608.

With continuing reference to FIG. 6, activation of the fast enable buffer 606 allows the inverted fast enable signal 610 to activate the PMOS transistor 128 in the headswitch circuit 106, allowing the supply voltage ($V_{DD}$) to be provided in a substantially instantaneous manner from the voltage supply source 102 to the powered circuit 104. In other words, the fast enable signal 604 transitioning to a logic high '1' value while the enable signal 122 has a logic low '0' value allows the switched power control circuit 600 to bypass the gradual activation of the headswitch circuit 106. Alternatively, the enable signal 122 transitioning to a logic high '1' value prevents activation of the PMOS transistor 136, while activating an NMOS transistor 612. The enable signal 122 is coupled to a gate (G) of the NMOS transistor 612. Further, a drain (D) of the NMOS transistor 612 is coupled to the source (S) of the NMOS transistor 130 of the current sink circuit 124, and a source (S) of the NMOS transistor 612 is coupled to a ground source 614. Thus, by activating the NMOS transistor 612, the enable signal 122 in this aspect allows a current to flow through the current sink circuit 124, thus allowing the current sink circuit 124 to condition the headswitch circuit 106 to gradually provide the supply voltage ($V_{DD}$) to the powered circuit 104.

With continuing reference to FIG. 6, similar to the switched power control circuit 400 in FIG. 4, multiple instances of the switched power control circuit 600 may be tiled to one another to form a block headswitch system. Thus, the switched power control circuit 600 also includes a fast enable output 616 that is configured to provide the fast enable signal 604 to other components.

Figure 7:
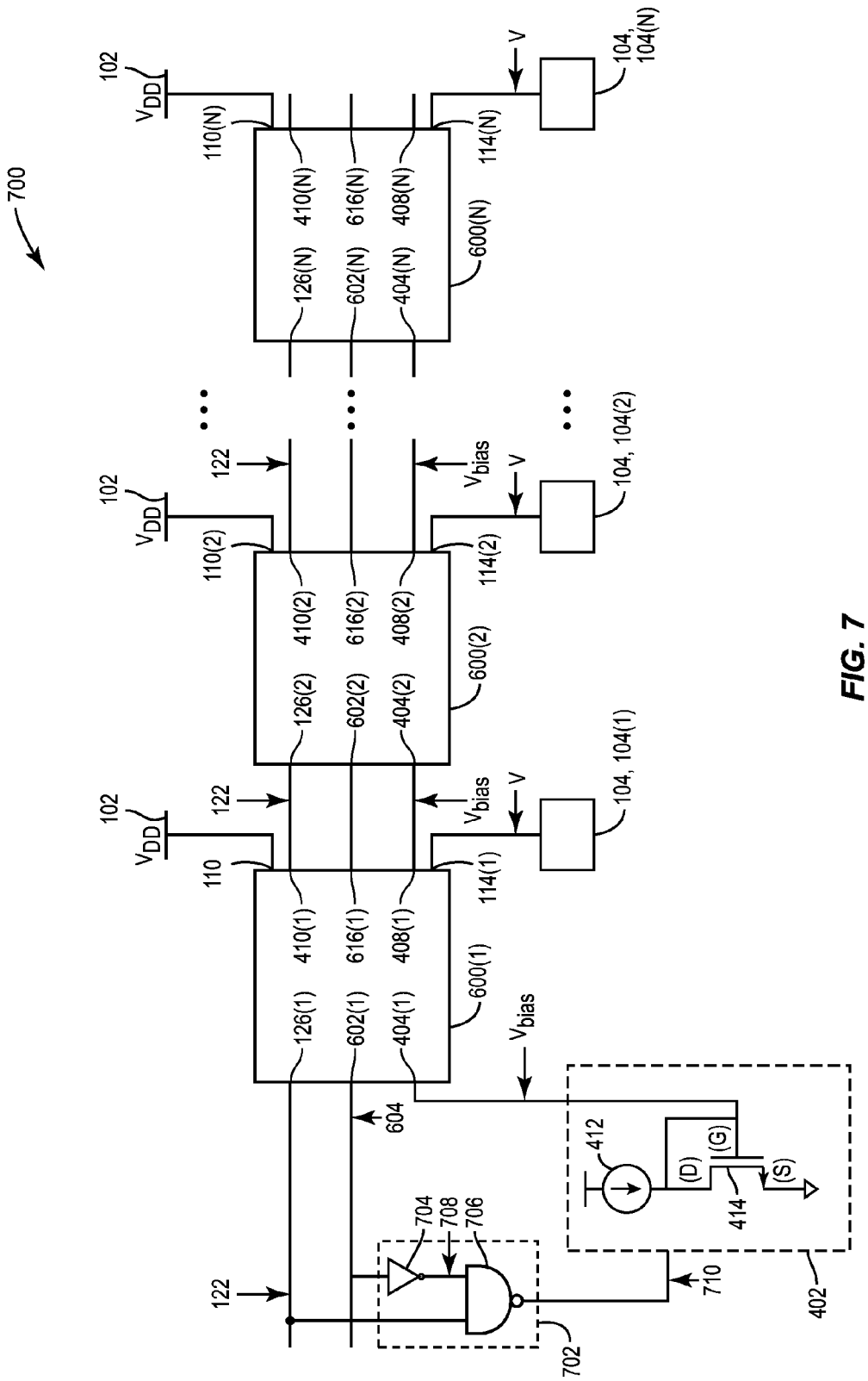
FIG. 7 is a block diagram of another exemplary block headswitch system configured to gradually provide a supply voltage to a processor core to reduce or avoid resonance on a power distribution network within the processor core.

In this regard, FIG. 7 illustrates an exemplary block headswitch system 700 that can be configured to gradually provide the supply voltage ($V_{DD}$) to the powered circuit 104 using the enable signal 122, or provide the supply voltage ($V_{DD}$) in a substantially instantaneous manner using the fast enable signal 604. The block headswitch system 700 includes switched power control circuits 600(1)-600(N), wherein each of the switched power control circuits 600(1)-600(N) is configured to receive the enable signal 122 and the fast enable signal 604. In this manner, if the enable signal 122 has a logic high '1' value, the block headswitch system 700 is configured to gradually provide the supply voltage ($V_{DD}$) to the powered circuit 104. However, if the fast enable signal 604 has a logic high '1' value while the enable signal 122 has a logic low '0' value, the block headswitch system 700 is configured to provide the supply voltage ($V_{DD}$) approximately instantaneously to the powered circuit 104. Notably, similar to the block headswitch system 500 in FIG. 5, each of the switched power control circuits 600(1)-600(N) in the block headswitch system 700 may be configured to provide the supply voltage ($V_{DD}$) to corresponding powered circuits 104(1)-104(N) rather than to multiple nodes of the single powered circuit 104.

With continuing reference to FIG. 7, the block headswitch system 700 also includes a bias enable circuit 702 that is configured to control activation of the bias generator circuit 402 in response to the enable signal 122 and the fast enable signal 604. In this aspect, the bias enable circuit 702 employs an inverter 704 and an NAND gate 706. The inverter 704 is configured to receive the fast enable signal 604 and provide an inverted fast enable signal 708 to the NAND gate 706. In addition to being configured to receive the inverted fast enable signal 708, the NAND gate 706 is configured to receive the enable signal 122. Further, the NAND gate 706 provides a bias control input signal 710 that controls activation of the bias generator circuit 402. In this aspect, the bias generator circuit 402 is activated in response to the bias control input signal 710 having a logic low '0' value. Thus, the bias enable circuit 702 is configured to activate the bias generator circuit 402 when the enable signal 122 and the fast enable signal 604 both have a logic high '1' value. By employing the bias enable circuit 702, the block headswitch system 700 is configured to employ the bias voltage ($V_{bias}$) for the switched power control circuits 600(1)-600(N) only when the enable signal 122 and the fast enable signal 604 indicate that the block headswitch system 700 is to provide the supply voltage ($V_{DD}$) gradually to the powered circuit 104 rather than in a substantially instantaneous manner.

Figure 8:
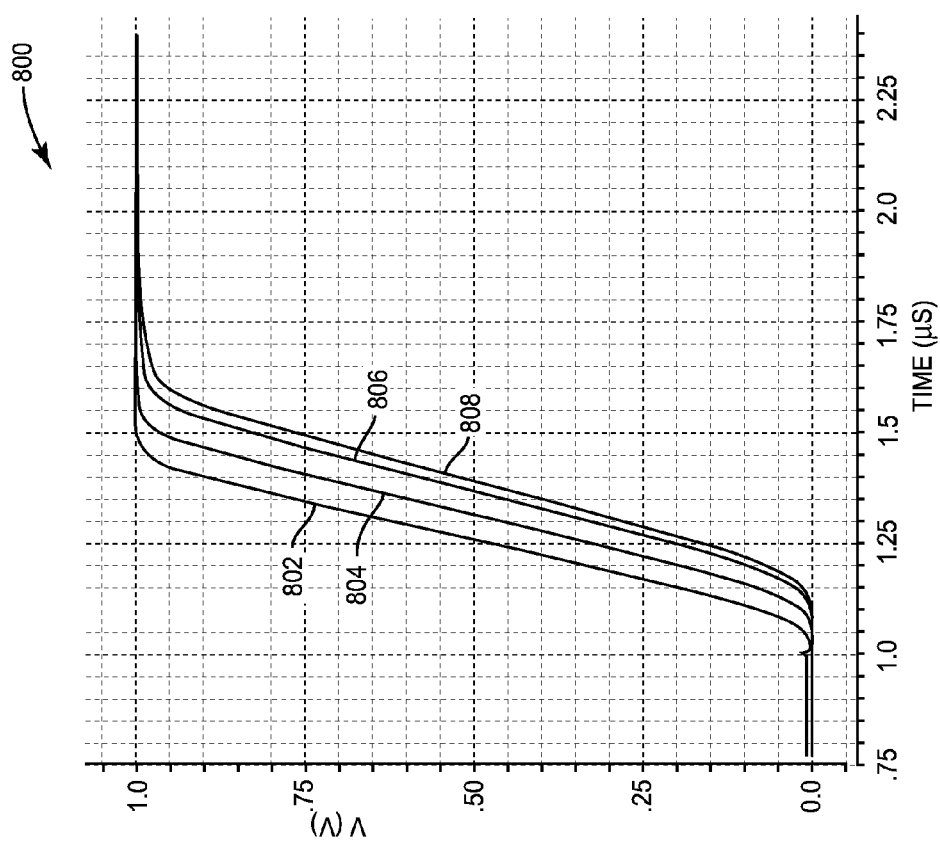
FIG. 8 is a graph illustrating that voltage slew rates resulting from the switched power control circuit in FIG. 4 are approximately equal across various levels of load current.

Voltage slew rates of the supply voltage ($V_{DD}$) provided by the switched power control circuits 100, 400, and 600 in FIGS. 1, 4, and 6 (referred to generally as the switched power control circuit 100) are now described. In this regard, FIG. 8 illustrates a graph 800 illustrating that voltage slew rates of the switched power control circuit 100 are approximately equal across various levels of load current. The graph 800 represents the amount of the supply voltage ($V_{DD}$) (i.e., the output voltage (V)) provided by the switched power control circuit 100 versus time. For example, line 802 represents the voltage slew rate resulting from the switched power control circuit 100 with a load current equal to three Amps (3 A). Line 804 represents the voltage slew rate resulting from the switched power control circuit 100 with a load current equal to one and one-half Amps (1.5 A). Further, lines 806, 808 represent the voltage slew rate of the switched power control circuit 100 with load currents of 200 mA and 20 mA, respectively. As illustrated by the graph 800, the lines 802, 804, 806, and 808 slew from zero Volts (0 V) to one Volt (1 V) at approximately equal voltage slew rates. Thus, the switched power control circuit 100 is configured to gradually provide the supply voltage ($V_{DD}$) at approximately equal voltage slew rates across varying load currents.

Figure 9:
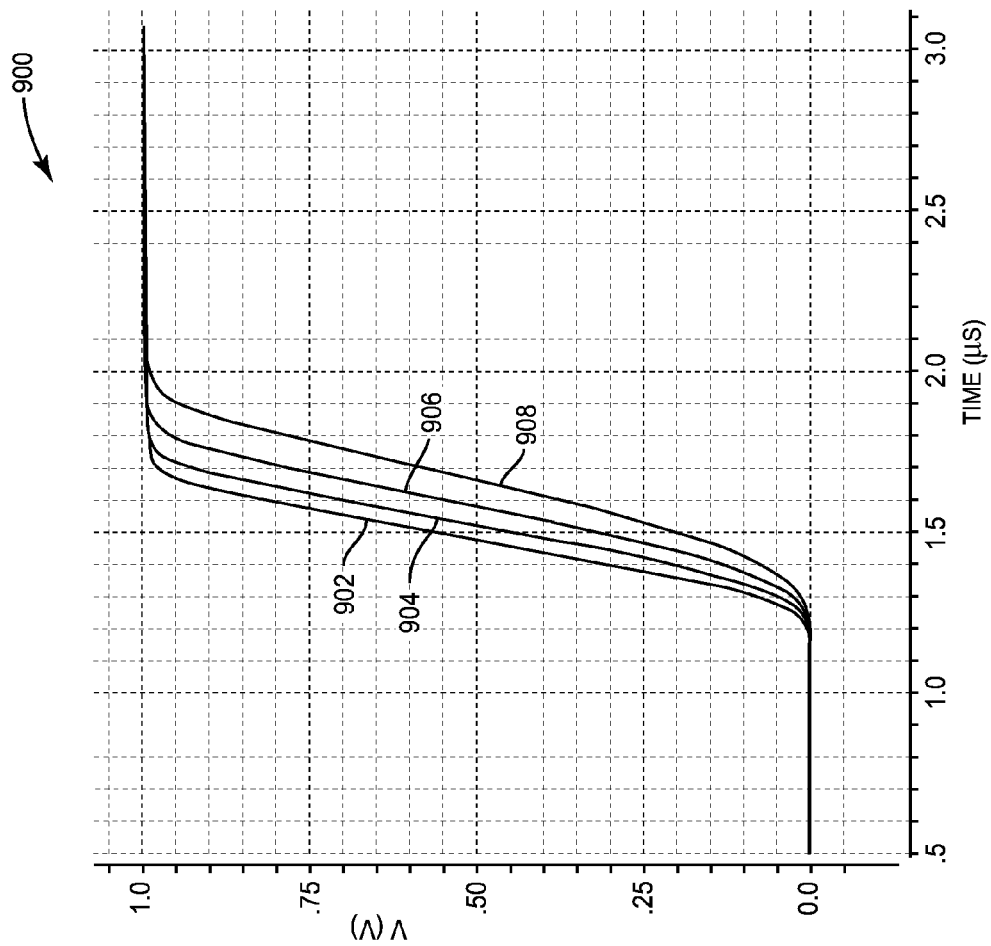
FIG. 9 is a graph illustrating that voltage slew rates resulting from the switched power control circuit in FIG. 4 are approximately equal across various levels of load capacitance of the powered circuit.

Additionally, the switched power control circuit 100 is configured to provide approximately equal voltage slew rates across varying load capacitances of the powered circuit 104. In this regard, FIG. 9 includes a graph 900 illustrating that voltage slew rates resulting from the switched power control circuit 100 are approximately equal across various levels of load capacitance of the powered circuit 104. The graph 900 represents the amount of the supply voltage ($V_{DD}$) (i.e., the output voltage (V)) provided by the switched power control circuit 100 versus time. For example, line 902 represents the voltage slew rate of the switched power control circuit 100 when the powered circuit 104 has a load capacitance of fifteen nano-Farads (15 nF). Line 904 represents the voltage slew rate of the switched power control circuit 100 when the powered circuit 104 has a load capacitance of thirty nF (30 nF). Further, lines 906, 908 represent the voltage slew rate of the switched power control circuit 100 when the powered circuit 104 has a load capacitance of sixty nF (60 nF) and 120 nF, respectively. As illustrated by the graph 900, the lines 902, 904, 906, and 908 slew from 0 V to 1 V at approximately equal voltage slew rates. Thus, the switched power control circuit 100 is configured to gradually provide the supply voltage ($V_{DD}$) at approximately equal voltage slew rates across varying load capacitances.

Figure 10:
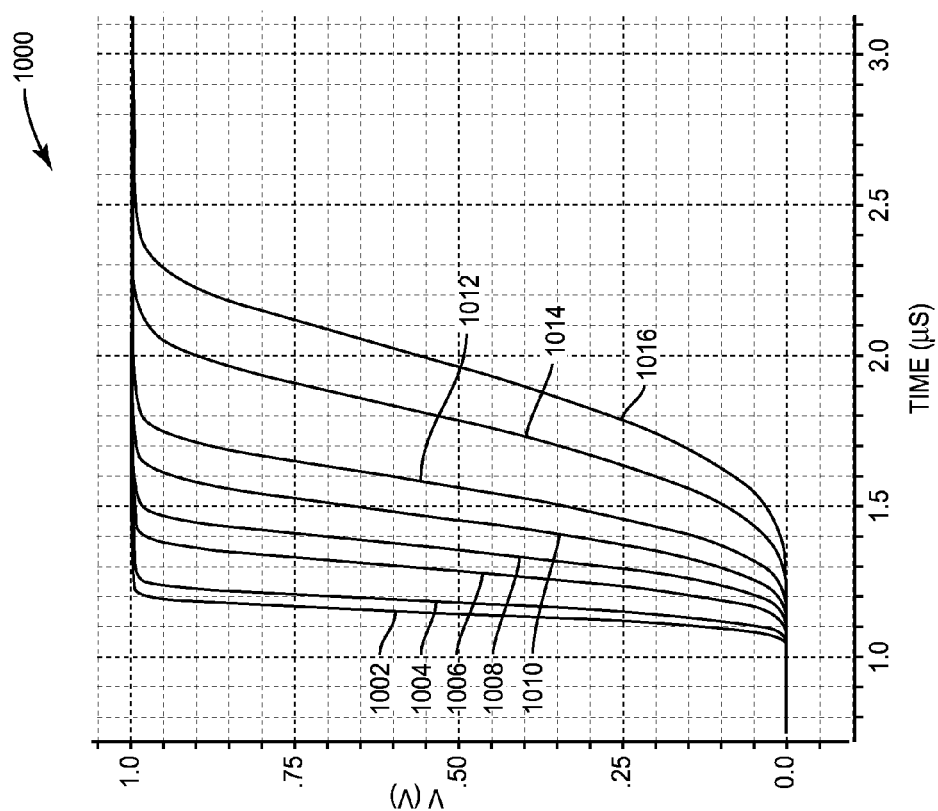
FIG. 10 is a graph illustrating voltage slew rates generated when a bias generator is used to bias the switched power control circuit in FIG. 4.

Additionally, as previously described, the bias generator circuit 402 is configured to provide the bias voltage ($V_{bias}$) so as to control the rate at which the headswitch circuit 106 is activated, thus controlling the voltage slew rate associated with the switched power control circuit 100. In this regard, FIG. 10 includes a graph 1000 illustrating voltage slew rates generated when the bias generator circuit 402 is used to bias the switched power control circuits 400, 600. The graph 1000 represents the amount of the supply voltage ($V_{DD}$) (i.e., the output voltage (V)) provided by the switched power control circuits 400, 600 versus time. Lines 1002, 1004, 1006, 1008, 1010, 1012, 1014, and 1016 represent varying voltage slew rates of the supply voltage ($V_{DD}$) provided by the switched power control circuits 400, 600 corresponding to varying levels of the bias voltage ($V_{bias}$) provided by the bias generator circuit 402. For example, the voltage slew rate associated with the line 1002 indicates that the supply voltage ($V_{DD}$) is provided from the switched power control circuits 400, 600 to the powered circuit 104 approximately instantaneously. However, the bias voltage ($V_{bias}$) applied to the current sink circuit 124 changes the voltage slew rate of the switched power control circuits 400, 600. Thus, the voltage slew rate associated with each of the lines 1004-1016 gradually increases as the bias current ($I_{bias}$) changes. Therefore, the bias generator circuit 402 may be used to condition the current sink circuit 124 so as to control the rate at which the headswitch circuit 106 is activated, thus controlling the voltage slew rates.

Figure 11:
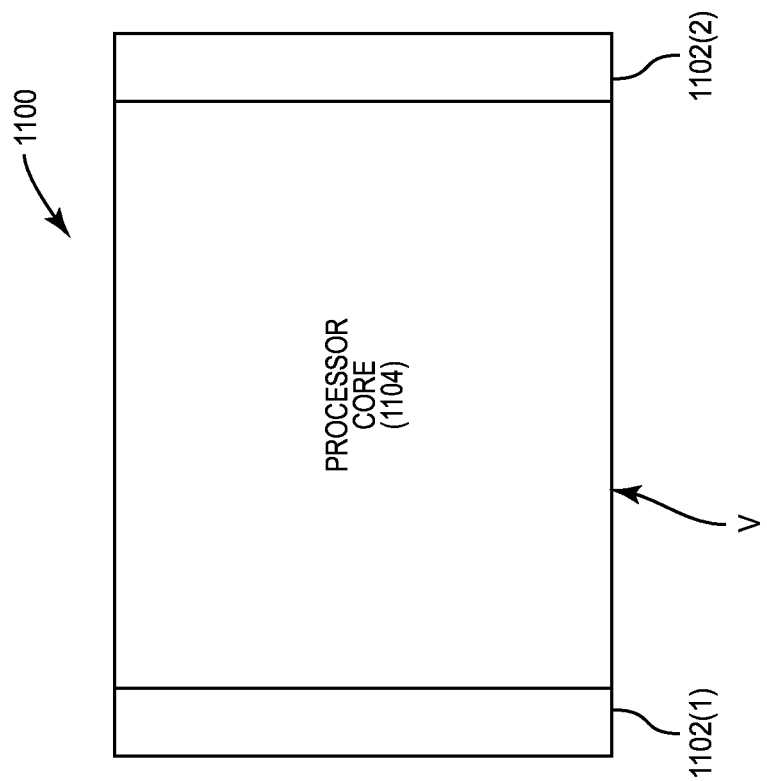
FIG. 11 is a block diagram illustrating a system wherein block headswitch systems are distributed around a processor core, and wherein the block headswitch systems are configured to gradually provide a supply voltage to the processor core.

As previously described in FIGS. 5 and 7, the switched power control circuits 400, 600 may be employed in the block headswitch systems 500, 700, respectively. In this regard, FIG. 11 illustrates a system 1100 wherein block headswitch systems 1102(1), 1102(2) are distributed around a processor core 1104, and wherein the block headswitch systems 1102(1), 1102(2) are configured to gradually provide a supply voltage ($V_{DD}$) to the processor core 1104. Notably, the block headswitch systems 1102(1), 1102(2) may be configured similar to the block headswitch systems 500, 700 in FIGS. 5 and 7, respectively. Further, although the block headswitch systems 1102(1), 1102(2) are distributed around the processor core 1104 in this aspect, alternative aspects may employ the block headswitch systems 1102(1), 1102(2) within the processor core 1104. By using the block headswitch systems 1102(1), 1102(2) to gradually provide the supply voltage ($V_{DD}$), the block headswitch systems 1102(1), 1102(2) reduce or avoid prolonged resonance on the power distribution network within the processor core 1104. Because the processor core 1104 delays operation until such resonance subsides, using the block headswitch systems 1102(1), 1102(2) to reduce or avoid this resonance increases the performance of the processor core 1104.

The switched power control circuits for controlling the rate of providing voltages to powered circuits according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a smart phone, a tablet, a phablet, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, and an automobile.

Figure 12:
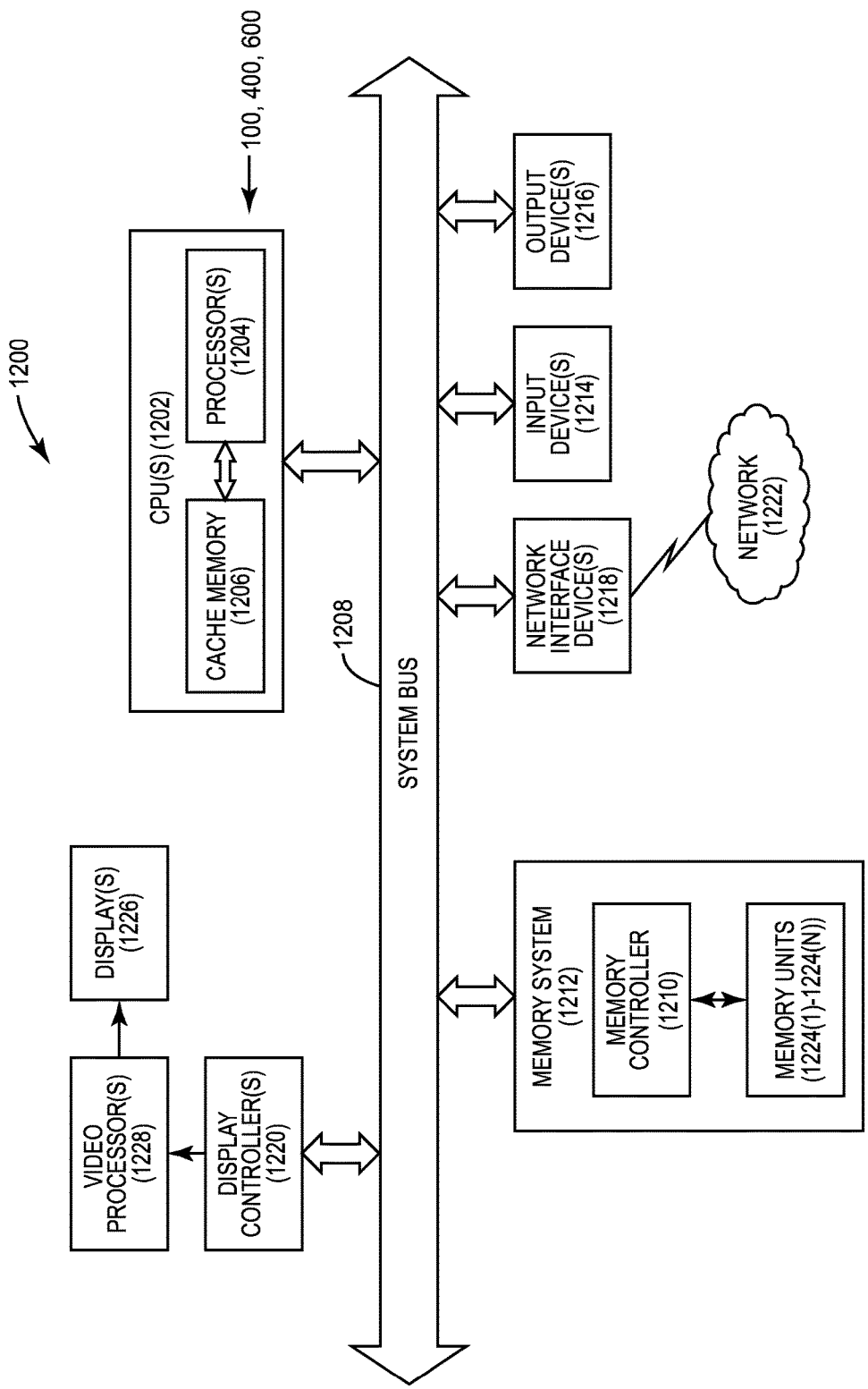
FIG. 12 is a block diagram of an exemplary processor-based system that can include the switched power control circuits of FIGS. 1 and 4 configured to gradually provide a supply voltage to a powered circuit to reduce or avoid resonance in the powered circuit.

In this regard, FIG. 12 illustrates an example of a processor-based system 1200 that can employ the switched power control circuits 100, 400, and 600 illustrated in FIGS. 1, 4, and 6. In this example, the processor-based system 1200 includes one or more central processing units (CPUs) 1202, each including one or more processors 1204, such as the processor core 1104 in FIG. 11. The CPU(s) 1202 may have cache memory 1206 coupled to the processor(s) 1204 for rapid access to temporarily stored data. The CPU(s) 1202 is coupled to a system bus 1208 and can intercouple master and slave devices included in the processor-based system 1200. As is well known, the CPU(s) 1202 communicates with these other devices by exchanging address, control, and data information over the system bus 1208. For example, the CPU(s) 1202 can communicate bus transaction requests to a memory controller 1210 as an example of a slave device. Although not illustrated in FIG. 12, multiple system buses 1208 could be provided, wherein each system bus 1208 constitutes a different fabric.

Other master and slave devices can be connected to the system bus 1208. As illustrated in FIG. 12, these devices can include a memory system 1212, one or more input devices 1214, one or more output devices 1216, one or more network interface devices 1218, and one or more display controllers 1220, as examples. The input device(s) 1214 can include any type of input device, including but not limited to input keys, switches, voice processors, etc. The output device(s) 1216 can include any type of output device, including but not limited to audio, video, other visual indicators, etc. The network interface device(s) 1218 can be any device configured to allow exchange of data to and from a network 1222. The network 1222 can be any type of network, including but not limited to a wired or wireless network, a private or public network, a local area network (LAN), a wireless local area network (WLAN), a wide area network (WAN), a BLUETOOTH™ network, or the Internet. The network interface device(s) 1218 can be configured to support any type of communications protocol desired. The memory system 1212 can include one or more memory units 1224(1)-1224(N).

The CPU(s) 1202 may also be configured to access the display controller(s) 1220 over the system bus 1208 to control information sent to one or more displays 1226. The display controller(s) 1220 sends information to the display(s) 1226 to be displayed via one or more video processors 1228, which process the information to be displayed into a format suitable for the display(s) 1226. The display(s) 1226 can include any type of display, including but not limited to a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A switched power control circuit, comprising:
a headswitch circuit configured to provide an output voltage generated from a voltage supply source to a powered circuit in response to a control signal received on a control input;
a control circuit configured to generate the control signal to control providing of the output voltage by the headswitch circuit to the powered circuit in response to an enable signal;
a current sink circuit coupled to the control input, the current sink circuit configured to control a ramping rate of the output voltage generated by the headswitch circuit;
a second enable input configured to receive a second enable signal; and
a buffer configured to:
receive the second enable signal; and
provide the second enable signal to the headswitch circuit;
wherein the buffer is activated in response to deactivation of the enable signal; and
wherein the headswitch circuit is further configured to provide a supply voltage of the voltage supply source to the powered circuit in a substantially instantaneous manner in response to the second enable signal.

2. The switched power control circuit of claim 1, wherein the current sink circuit is configured to control the ramping rate by being configured to progressively ramp up the output voltage to the supply voltage of the voltage supply source.

3. The switched power control circuit of claim 1, further comprising a bias generator coupled to a bias input of the current sink circuit, wherein the bias generator is configured to provide a bias voltage that biases the current sink circuit so as to control a rate at which the headswitch circuit is activated.

4. The switched power control circuit of claim 1, further comprising a second enable output configured to provide the second enable signal.

5. The switched power control circuit of claim 1, further comprising an enable input configured to receive the enable signal.

6. The switched power control circuit of claim 5, further comprising an enable output configured to provide the enable signal.

7. The switched power control circuit of claim 1, further comprising:
a bias generator input coupled to a bias input of the current sink circuit; and
the bias generator input configured to receive a bias voltage from a bias generator, wherein the bias generator is configured to provide the bias voltage that biases the current sink circuit, wherein the current sink circuit is configured to mirror a bias current so as to control a rate at which the headswitch circuit is activated.

8. The switched power control circuit of claim 7, further comprising a bias generator output configured to provide the bias voltage.

9. The switched power control circuit of claim 1, wherein the headswitch circuit comprises a p-type metal oxide semiconductor (PMOS) transistor, the PMOS transistor comprising:
a source coupled to a voltage input of the headswitch circuit;
a gate coupled to the control input of the headswitch circuit; and
a drain coupled to a voltage output of the headswitch circuit.

10. The switched power control circuit of claim 9, wherein the control circuit comprises a PMOS transistor, the PMOS transistor comprising:
a source coupled to the voltage supply source;
a gate configured to receive the enable signal; and
a drain coupled to the gate of the PMOS transistor of the headswitch circuit and the current sink circuit.

11. The switched power control circuit of claim 10, wherein the current sink circuit comprises an n-type metal oxide semiconductor (NMOS) transistor, the NMOS transistor comprising:
a drain coupled to the gate of the PMOS transistor of the headswitch circuit;
a gate coupled to a bias generator; and
a source coupled to a ground source.

12. The switched power control circuit of claim 1 integrated into an integrated circuit (IC).

13. The switched power control circuit of claim 1 integrated into a device selected from the group consisting of: a set top box; an entertainment unit; a navigation device; a communications device; a fixed location data unit; a mobile location data unit; a mobile phone; a cellular phone; a smart phone; a tablet; a phablet; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

14. A switched power control circuit, comprising:
a means for providing an output voltage generated from a voltage supply source to a powered circuit in response to a control signal received on a control input;
a means for generating the control signal to control providing of the output voltage by the means for providing the output voltage to the powered circuit in response to an enable signal;
a means for controlling a ramping rate of the output voltage generated by the means for providing the output voltage to the powered circuit;
a means for receiving a second enable signal; and
a means for buffering the second enable signal configured to provide the second enable signal to the means for providing the output voltage;
wherein the means for buffering is activated in response to deactivation of the enable signal; and
wherein the means for providing the output voltage is configured to provide a supply voltage of the voltage supply source to the powered circuit in a substantially instantaneous manner in response to the second enable signal.

15. A method for gradually providing a supply voltage to a powered circuit, comprising:
  generating a control signal to control providing of an output voltage generated from a voltage supply source by a headswitch circuit to the powered circuit in response to an enable signal;
  controlling a ramping rate of the output voltage generated by the headswitch circuit by a current sink circuit coupled to a control input of the headswitch circuit;
  providing the output voltage to the powered circuit from the headswitch circuit in response to the control signal received on the control input;
  receiving a second enable signal;
  buffering the second enable signal, wherein the second enable signal is provided to the headswitch circuit in response to deactivation of the enable signal; and
  providing the supply voltage of the voltage supply source to the powered circuit in a substantially instantaneous manner in response to the second enable signal.

16. The method of claim 15, wherein controlling the ramping rate of the output voltage comprises progressively ramping up the output voltage to the supply voltage of the voltage supply source.

17. The method of claim 15, further comprising biasing the current sink circuit so as to control a rate at which the output voltage is provided to the powered circuit.

18. The method of claim 17, wherein biasing the current sink circuit comprises providing a bias voltage that biases the current sink circuit so as to control a rate at which the headswitch circuit is activated.

19. A block headswitch system, comprising:
  a plurality of switched power control circuits, each switched power control circuit comprising:
    an enable input configured to receive an enable signal;
    an enable output configured to provide the enable signal;
    a headswitch circuit configured to provide an output voltage generated from a voltage supply source to a powered circuit in response to a control signal received on a control input;
    a control circuit configured to generate the control signal to control providing of the output voltage by the headswitch circuit to the powered circuit in response to the enable signal;
    a current sink circuit coupled to the control input, the current sink circuit configured to control a ramping rate of the output voltage generated by the headswitch circuit;
    a second enable input configured to receive a second enable signal;
    a second enable output configured to provide the second enable signal; and
    a buffer configured to:
      receive the second enable signal; and
      provide the second enable signal to the headswitch circuit;
      wherein the buffer is activated in response to deactivation of the enable signal; and
    wherein the headswitch circuit is further configured to provide a supply voltage of the voltage supply source to the powered circuit in a substantially instantaneous manner in response to receiving the second enable signal.

20. The block headswitch system of claim 19, wherein the current sink circuit of each switched power control circuit of the plurality of switched power control circuits is configured to control the ramping rate by being configured to progressively ramp up the output voltage to the supply voltage of the voltage supply source.

21. The block headswitch system of claim 19, further comprising:
  a bias generator configured to provide a bias voltage that biases the current sink circuit of each switched power control circuit of the plurality of switched power control circuits, wherein the current sink circuit mirrors a bias current so as to control a rate at which the headswitch circuit of each switched power control circuit is activated;
  wherein each switched power control circuit of the plurality of switched power control circuits further comprises:
    a bias generator input configured to receive the bias voltage; and
    a bias generator output configured to provide the bias voltage.

22. The block headswitch system of claim 19, wherein the headswitch circuit of each switched power control circuit of the plurality of switched power control circuits comprises a p-type metal oxide semiconductor (PMOS) transistor, the PMOS transistor comprising:
  a source coupled to a voltage input of the headswitch circuit;
  a gate coupled to the control input of the headswitch circuit; and
  a drain coupled to a voltage output of the headswitch circuit.

23. The block headswitch system of claim 22, wherein the control circuit of each switched power control circuit of the plurality of switched power control circuits comprises a PMOS transistor, the PMOS transistor comprising:
  a source coupled to the voltage supply source;
  a gate configured to receive the enable signal; and
  a drain coupled to the gate of the PMOS transistor of the headswitch circuit and the current sink circuit.

24. The block headswitch system of claim 23, wherein the current sink circuit of each switched power control circuit of the plurality of switched power control circuits comprises an n-type metal oxide semiconductor (NMOS) transistor, the NMOS transistor comprising:
  a drain coupled to the gate of the PMOS transistor of the headswitch circuit;
  a gate coupled to a bias generator; and
  a source coupled to a ground source.

* * * * *